United States Patent
Zang et al.

(10) Patent No.: US 10,804,379 B2
(45) Date of Patent: Oct. 13, 2020

(54) FINFET DEVICE AND METHOD OF MANUFACTURING

(71) Applicant: GLOBALFOUNDRIES Inc., Grand Cayman (KY)

(72) Inventors: Hui Zang, Guilderland, NY (US); Ruilong Xie, Niskayuna, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/980,436

(22) Filed: May 15, 2018

(65) Prior Publication Data

US 2019/0355838 A1    Nov. 21, 2019

(51) Int. Cl.
| | |
|---|---|
| H01L 29/66 | (2006.01) |
| H01L 29/78 | (2006.01) |
| H01L 29/49 | (2006.01) |
| H01L 27/088 | (2006.01) |
| H01L 21/8234 | (2006.01) |
| H01L 21/768 | (2006.01) |
| H01L 21/28 | (2006.01) |

(52) U.S. Cl.
CPC .. *H01L 29/66795* (2013.01); *H01L 21/28079* (2013.01); *H01L 21/76895* (2013.01); *H01L 27/0886* (2013.01); *H01L 29/66545* (2013.01); *H01L 29/7848* (2013.01)

(58) Field of Classification Search
CPC .......... H01L 29/66795; H01L 29/7848; H01L 29/66545; H01L 21/28079; H01L 21/76895; H01L 21/823864; H01L 21/82385; H01L 21/823878; H01L 27/0886; H01L 21/762; H01L 21/8232; H01L 21/238; H01L 21/823481; H01L 21/823456; H01L 21/823431; H01L 21/823821; H01L 29/6681; H01L 29/0642; H01L 29/785; H01L 29/7831; H01L 29/7855; H01L 23/5329
USPC .................. 257/192, 365, 328, 308; 438/283
See application file for complete search history.

(56) References Cited

U.S. PATENT DOCUMENTS

| | | | |
|---|---|---|---|
| 9,390,928 B2 * | 7/2016 | Alptekin | H01L 29/772 |
| 9,985,023 B1 * | 5/2018 | Liu | H01L 29/78696 |
| 10,056,473 B1 * | 8/2018 | Wang | H01L 29/66545 |

(Continued)

FOREIGN PATENT DOCUMENTS

| | | |
|---|---|---|
| TW | 201511283 A | 3/2015 |
| TW | 201735266 A | 10/2017 |
| TW | 201814796 A | 4/2018 |

*Primary Examiner* — Natalia A Gondarenko
(74) *Attorney, Agent, or Firm* — Ditthavong & Steiner, P.C.

(57) ABSTRACT

A method for producing a finFET to prevent gate contact and trench silicide (TS) electrical shorts. Embodiments include forming a finFET over a substrate, the finFET comprising an epi S/D region formed at sides of a gate; forming an α-Si layer in a recess over the epi S/D; forming an oxide layer over the α-Si layer; forming a non-TS isolation opening over the substrate; forming a low dielectric constant layer in the non-TS isolation opening; removing the oxide layer and α-Si layer; forming an opening over the gate and an opening over the epi S/D region; and forming a gate contact in the opening over the gate and an epi S/D contact over the opening over the epi S/D region.

5 Claims, 11 Drawing Sheets

(56) References Cited

U.S. PATENT DOCUMENTS

2015/0108590 A1     4/2015  Alptekin et al.
2017/0317078 A1*   11/2017  Chang ................. H01L 29/0649
2019/0006515 A1*    1/2019  Cheng ................... H01L 29/785

* cited by examiner

FINFET DEVICE AND METHOD OF MANUFACTURING

TECHNICAL FIELD

The present disclosure relates to semiconductor fabrication. In particular, the present disclosure relates to fin field effect transistor (finFET) fabrication.

BACKGROUND

FinFETs are common in switching, amplification, filtering, etc. in electronics. FinFETs exhibit ideal short channel behavior, and include a channel formed in a vertical fin. The finFET structure may be fabricated using layout and processing steps similar to those used for conventional planar metal-oxide-semiconductor field-effect transistors (MOSFETs).

There are ever increasing demands for higher density and performance associated with integrated circuit devices requiring certain design features, such as reduced gate lengths, high reliability and increased manufacturing. The continued reduction of critical dimensions has challenged the limitations of conventional fabrication techniques. New device structures are therefore being explored to improve finFET performance and allow further device scaling.

Figure 1:
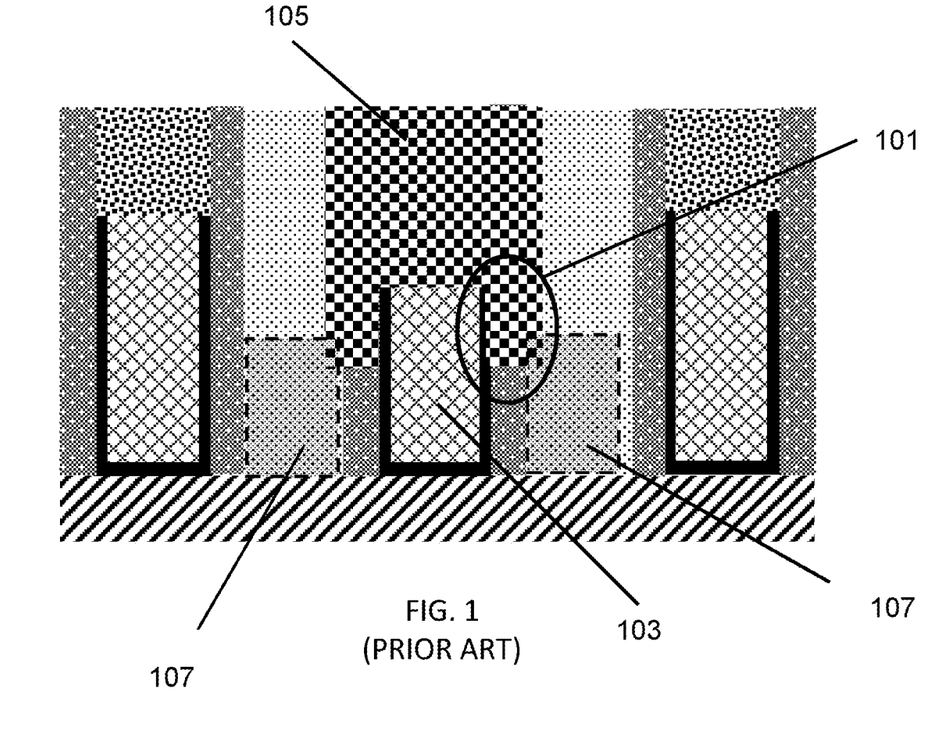
FIG. 1 schematically illustrates in cross-sectional views a finFET device produced with conventional processing that results in gate contact and epi S/D shorts.

Conventional trench silicide processing results in an over etching of gate contact cavity which can reach epi S/D regions and result in an electrical short. FIG. 1 illustrates, in cross-sectional view, an over etch region 101 formed around a high dielectric constant metal gate (HKMG) 103. Once the cavity is filled with a metal to form gate contact 105, the gate contact 105 is in contact with the epi S/D region 107. This type of short can also occur during replacement contact with low dielectric constant isolation techniques that result in an over etch creating a cavity that can extend to epi S/D region 107.

A need therefore exists for methodology enabling fabrication of finFET devices without gate contact to epi S/D electrical shorts.

SUMMARY

An aspect of the present disclosure is a method for forming a middle of line (MOL) finFET device that prevents gate contact and epi S/D shorts, and the related device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a finFET over a substrate, the finFET including an epi S/D region formed at sides of a gate; forming an amorphous silicon (a-Si) layer in a recess over the epi S/D; forming an oxide layer over the a-Si layer; forming a non-trench silicide (non-TS) isolation opening over the substrate; forming a low dielectric constant layer in the non-TS isolation opening; removing the oxide layer and a-Si layer to form an opening over epi S/D region; and forming a gate contact in an opening over the gate and an epi S/D contact over the opening over the epi S/D region.

Aspects of the present disclosure include the finFET having the epi S/D region formed at sides of a polysilicon dummy gate. Other aspects include the epi S/D include epitaxially grown silicon germanium (SiGe). Yet further aspects include, after forming the oxide layer over the a-Si layer, replacing the polysilicon dummy gate with a metal gate or HKMG. Another aspect includes the gate contact including tantalum, tungsten, titanium, or aluminum. Other aspects include forming a silicon nitride cap over the gate. Another aspect includes forming the low dielectric constant layer of silicon oxide. Yet another aspect includes the silicon oxide including a silicon oxycarbide (SiOC) or silicon carbide (SiC). Other aspects include forming and patterning a photoresist layer over the substrate; and etching through the photoresist to form the opening over the gate and the opening over the epi S/D region.

Another aspect of the present disclosure is a device including: finFETs formed over a substrate, wherein one of the finFETs includes an epi S/D region formed at sides of a HKMG; a low dielectric constant layer formed between the finFETs; and a gate contact formed on an upper surface of the HKMG when viewed in cross-section and the gate contact not being in contact with the epi S/D region.

Aspects of the present disclosure include the epi S/D including epitaxially grown SiGe. Other aspects include the gate contact including tantalum, tungsten, titanium, or aluminum. Yet further aspects include low dielectric constant layer being silicon oxide. Another aspect includes the silicon oxide including SiOC or SiC.

Yet another aspect of the present disclosure is a method including: forming a finFET over a substrate, the finFET comprising a gate, sidewall spacer, and epi S/D region; forming a first dielectric over the epi S/D region, the first dielectric comprising a bottom photoresist layer and a top dielectric cap; removing a first portion of the first dielectric from a non-TS isolation region; removing the sidewall spacer from the gate to form an opening between the gate and the epi S/D region; filling the opening between the gate and the epi S/D region with a second dielectric; removing a second portion of the first dielectric to expose the bottom photoresist layer over the epi S/D region; removing the bottom photoresist layer to expose the epi S/D region; removing a gate cap to expose the gate; and forming epi S/D contact and gate contact.

Aspects of the present disclosure include removing the sidewall spacer and a high dielectric constant layer. Other aspects include forming the finFET with the epi S/D region formed at sides of a polysilicon dummy gate. Yet further aspects include the epi S/D including epitaxially grown SiGe. Another aspect includes replacing the polysilicon dummy gate with a metal gate or HKMG. Other aspects include the gate contact including tantalum, tungsten, titanium, or aluminum.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of gate contact and nearby epi S/D regions attendant upon conventional finFET device fabrication. Methodology in accordance with embodiments of the present disclosure includes forming a finFET over a substrate, the finFET including an epi S/D region formed at sides of a gate; forming an a-Si layer in a recess over the epi S/D; forming an oxide layer over the a-Si layer; forming a non-TS isolation opening over the substrate; forming a low dielectric constant layer in the non-TS isolation opening; removing the oxide layer and a-Si layer; forming an opening over the gate and an opening over the epi S/D region; and forming a gate contact in the opening over the gate and an epi S/D contact over the opening over the epi S/D region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
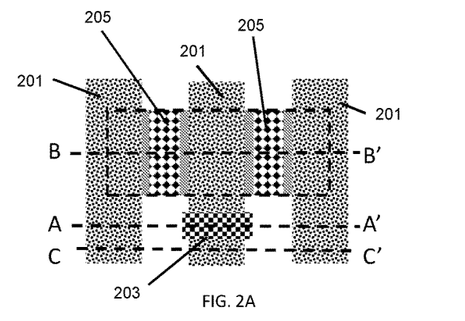
FIG. 2A schematically illustrates in top view, a finFET device with gate contact produced in accordance with an exemplary embodiment.
Figure 2B:
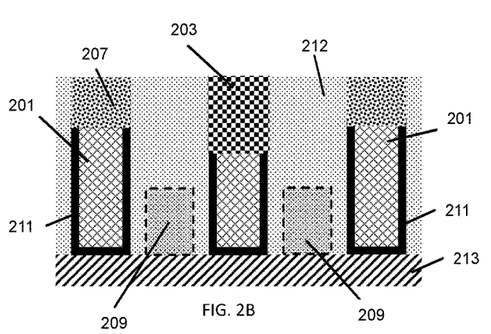
FIGS. 2B-2D schematically illustrate in cross-sectional views along multiple lines of FIG. 2A, a finFET device, in accordance with an exemplary embodiment.

FIG. 2A, is a top view of a finFET device including metal gates 201 or HKMGs 201, as well as gate contact 203 and S/D contacts 205, in accordance with an exemplary embodiment. FIG. 2B is a cross-sectional view along line A-A' of FIG. 2A. In FIG. 2B, metal gates or HKMGs 201 are shown in cross-section. In this example, HKMGs 201 are illustrated. Nitride caps 207 are formed over two of the HKMGs 201, while one of the HKMGs 201 includes gate contact 203 which is limited to the upper surface of the one HKMG 201. The nitride caps 207 can be formed of silicon nitride (SiN). The gate contact 203 is formed of a metal and can be selected from tantalum, tungsten, titanium, or aluminum. The gate contact 203 is limited to the upper surface of the middle HKMG 201 and does not extend down to the epi S/D regions 209, which illustrated in the background of FIG. 2B. In FIG. 2B, the HKMGs 201 can include a high-k dielectric layer 211. The high-k dielectric layer 211 can include $HfO_2$, $ZrO_2$, $La_2O_3$, $Al_2O_3$, $TiO_2$, $SrTiO_3$, $LaAlO_3$, $Y_2O_3$, etc. The HKMG may include a metal or metal compound such as, Mo, Cu, W, Ti, Ta, TiN, TaN, NiSi, CoSi, and/or other suitable conductive materials. A low dielectric constant (low-k) dielectric layer 212 is on sides of the HKMGs 201 in FIG. 2B. STI region 213 is formed between fins. The HKMGs 201 in FIG. 2B are in direct contact with the low-k dielectric layer 212 in the non-TS isolation region. A low-k is a material with a small dielectric constant relative to silicon dioxide ($SiO_2$). The dielectric constant of $SiO_2$ is 3.9. Examples of low-k materials for layer 212 include SiOC or SiC which have a dielectric constant below 3.9.

Figure 2C:
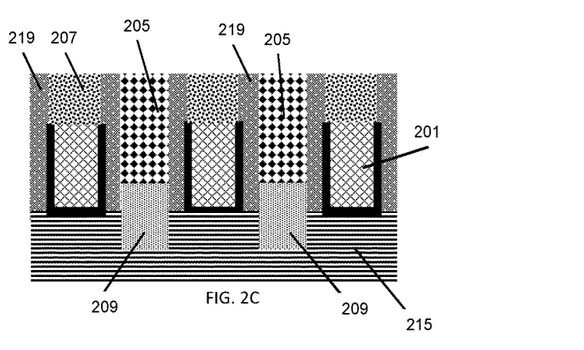
Figure 2D:
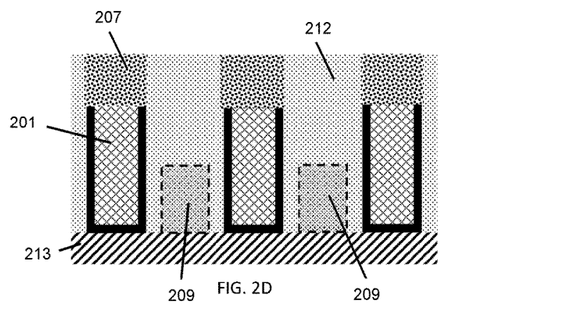

FIG. 2C is a cross-sectional view along line B-B' of FIG. 2A. The epi S/D regions 209 are illustrated in the foreground in this view. An epitaxial growing process is performed to merge the semiconductor material of the silicon fins 215 with an epitaxially grown layer or "epi" layer. S/D contacts 205 are formed of a metal over the S/D region 209. The starting finFET structure may be formed on any suitable substrate, such as a silicon-on-insulator (SOI), silicon-germanium (SiGe) or a bulk semiconductor substrate. A plurality of semiconductor fins 215 is formed on the substrate using any technique suitable in the art, including photoresist/hardmask patterning and etching. The semiconductor material for both the fins 215 and the epi S/D region 209 may be the same (e.g., silicon, SiGe). The shallow trench isolation (STI) region 213 is disposed between fins. The STI region can include silicon dioxide ($SiO_2$). The fin portions not under the HKMG structures are then optionally doped to form epi S/D regions 209. Epi S/D regions 209 are formed at opposite sides of the HKMGs 201. The fins 215 include the channels of a finFET and will be coupled to the epi S/D region 209 of the finFET. Sidewall spacers 219 are illustrated on sides of the HKMGs 201 in FIG. 2C. FIG. 2D is a cross-sectional view along line C-C' of FIG. 2A.

Figure 2E:
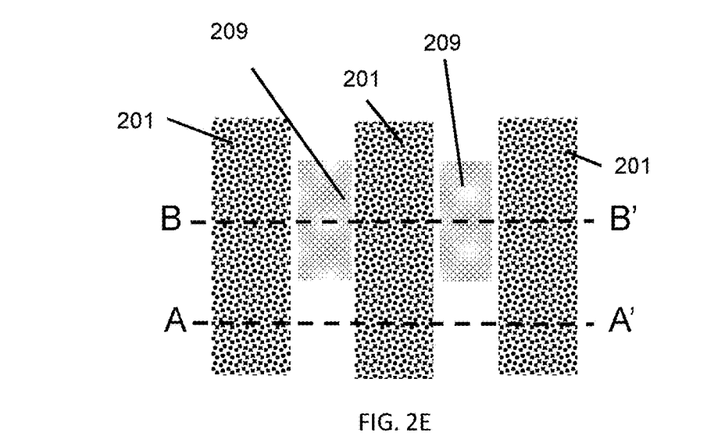
FIG. 2E schematically illustrates in top view, a finFET device in accordance with an exemplary embodiment.
Figure 2F:
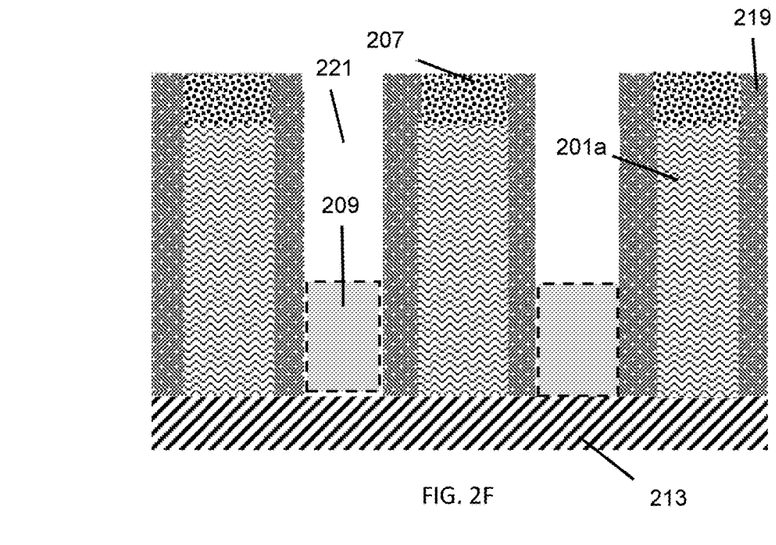
FIGS. 2F through 2W schematically illustrate in cross-sectional views along multiple lines of FIG. 2E, process steps for fabricating a finFET device, in accordance with an exemplary embodiment.
Figure 2G:
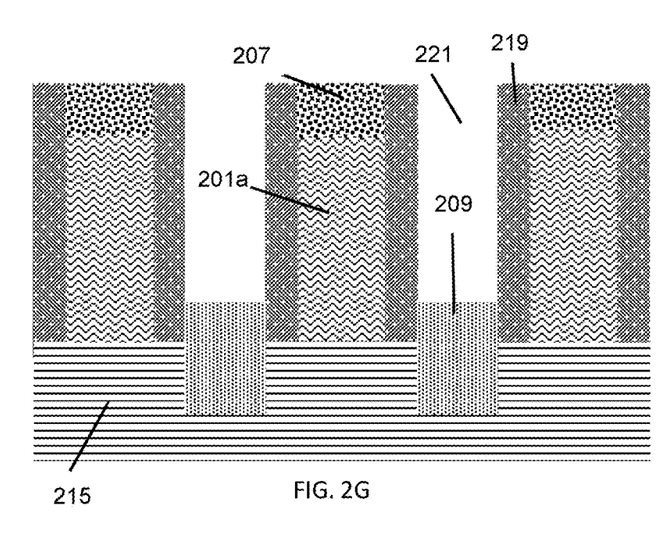

FIG. 2E, is a top view of a finFET device including dummy polysilicon gates 201a and epi S/D regions. FIG. 2F is a cross-sectional view along line A-A' of FIG. 2E. In FIG. 2F, the polysilicon dummy gates include sidewall spacers 219 and epi S/D regions 209 formed at opposite sides of the dummy polysilicon gates 201a. SiN caps 207 are formed over upper surfaces of the dummy polysilicon gates 201a. FIG. 2G is a cross-sectional view along line B-B' of FIG. 2E. The fins 215 include the channels of a finFET and will be coupled to the epi S/D region 209 of the finFET. Openings 221 are formed over epi S/D regions 209. FIG. 2G is a cross-sectional view along line B-B' of FIG. 2E.

Figure 2H:
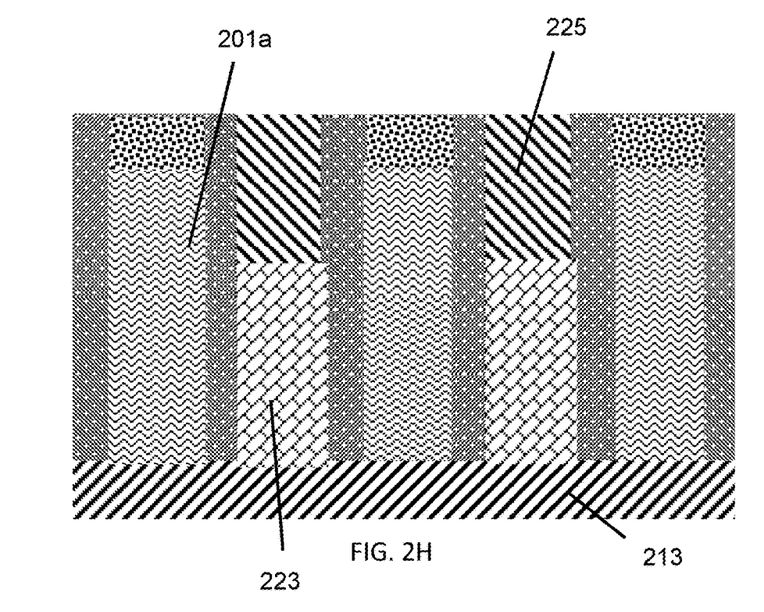
Figure 2I:
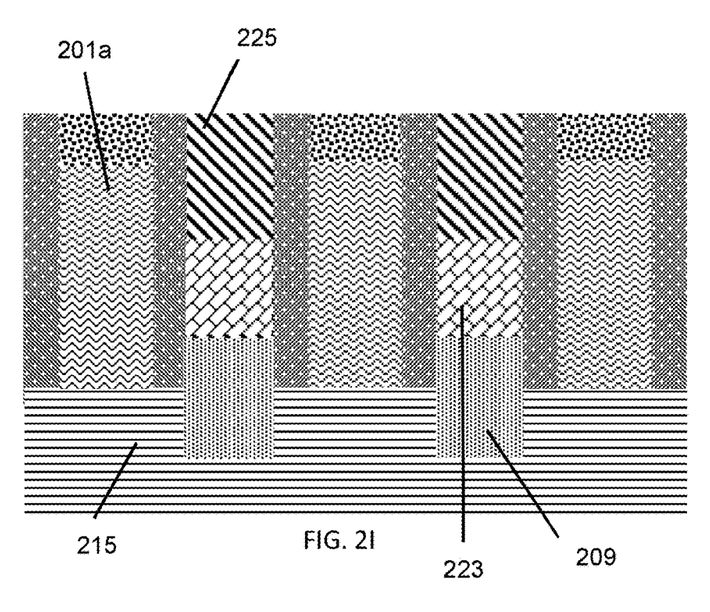

FIG. 2H is a cross-sectional view along line A-A' of FIG. 2E. FIG. 2I is a cross-sectional view along line B-B' of FIG. 2E. The openings 221 (FIGS. 2F and 2G) are filled with a bi-layer inter layer dielectric (ILD). The bilayer ILD includes a bottom photoresist layer 223 and a top dielectric cap 225. The bottom photoresist layer 223 is a sacrificial layer and can include an amorphous silicon (a-Si) formed to at thickness of 0.01 to 0.7 µm. The top dielectric cap 225 is formed of an oxide including $SiO_2$ formed to at thickness of 0.01 to 0.7 µm.

Figure 2J:
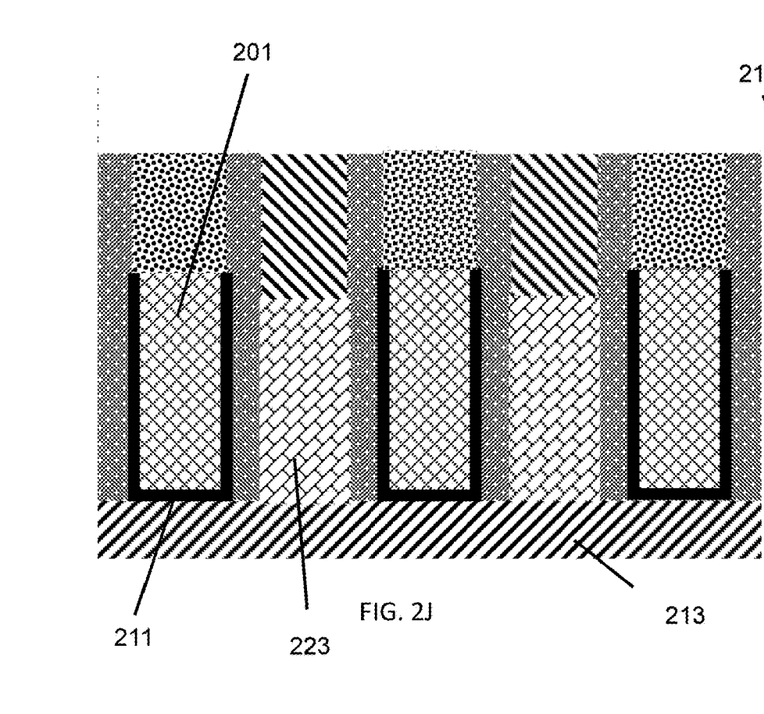
Figure 2K:
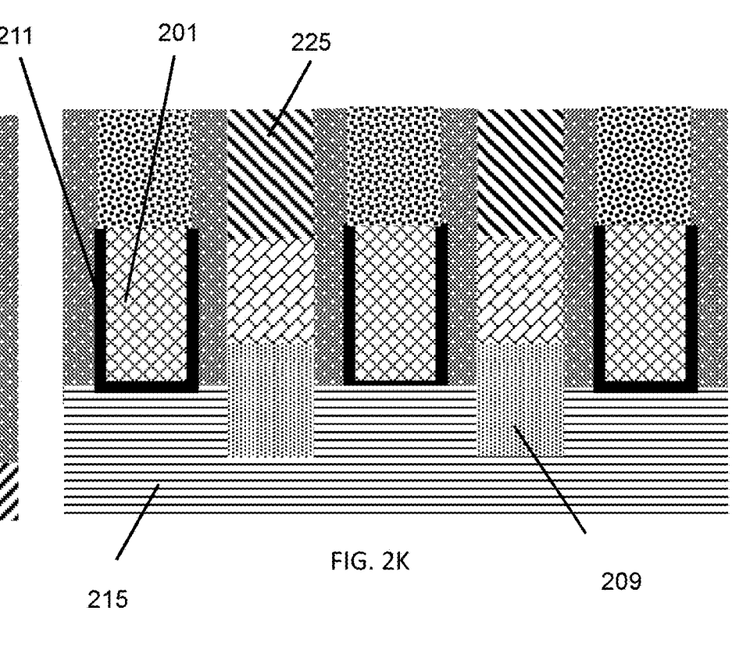

FIGS. 2J and 2K illustrate in cross-sectional views, the dummy polysilicon gate 201a removal and replacement metal gate (RMG) deposition to form HGMGs 201. FIG. 2J is a cross-sectional view along line A-A' of FIG. 2E. FIG. 2K is a cross-sectional view along line B-B' of FIG. 2E.

Figure 2L:
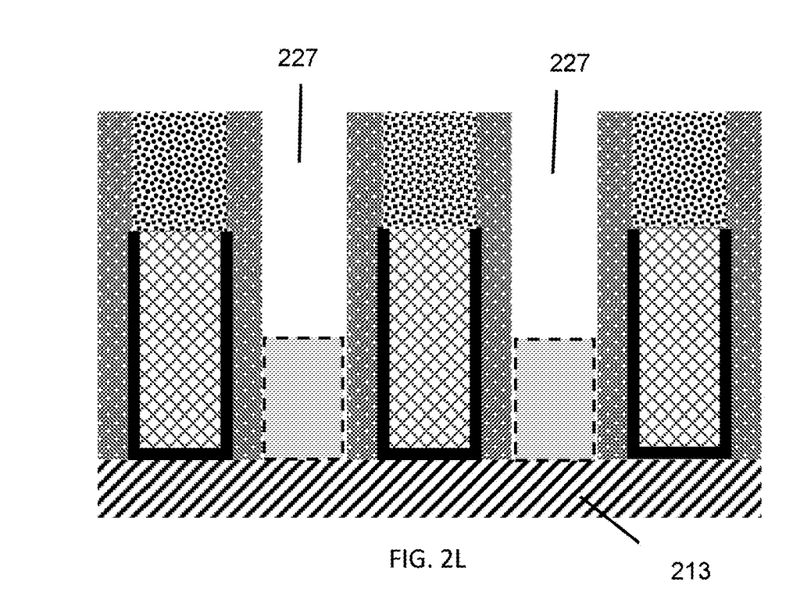
Figure 2M:
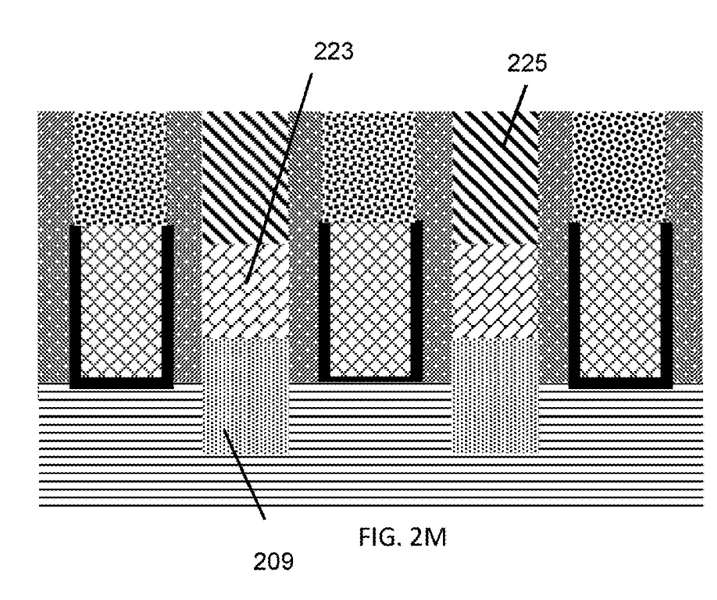

FIG. 2L is a cross-sectional view along line A-A' of FIG. 2E. FIG. 2M is a cross-sectional view along line B-B' of FIG. 2E. A first portion of the bilayer ILD, including the bottom photoresist layer 223 and top dielectric cap 225, is removed from a non-TS isolation region 227 over the STI region 213 in FIG. 2L. The bilayer ILD in FIG. 2M remains over epi S/D region 209.

Figure 2N:
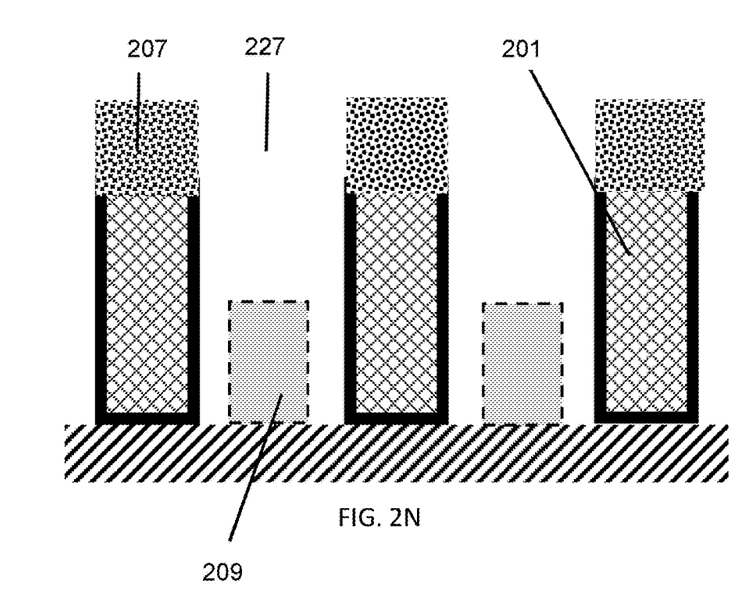
Figure 2O:
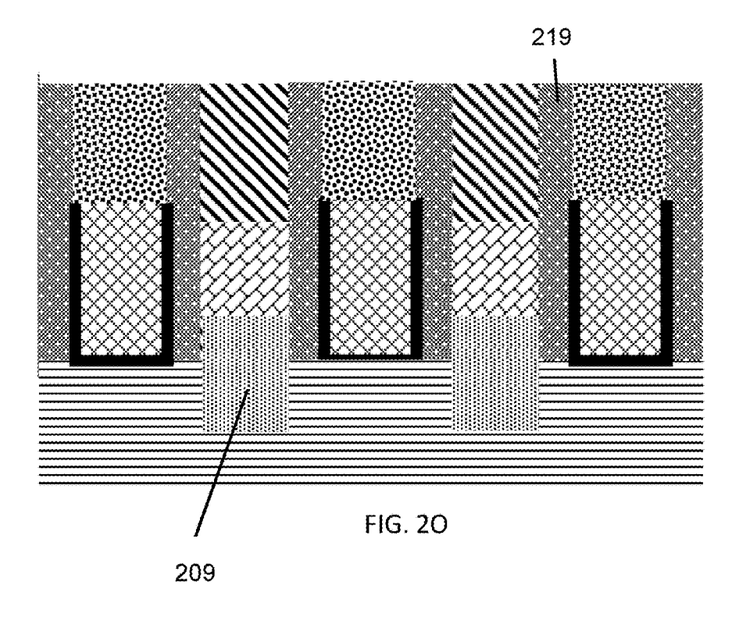

FIG. 2N is a cross-sectional view along line A-A' of FIG. 2E. FIG. 2O is a cross-sectional view along line B-B' of FIG. 2E. Sidewall spacers 219 are removed from the non-TS isolation region 227, as shown in FIG. 2N.

Figure 2P:
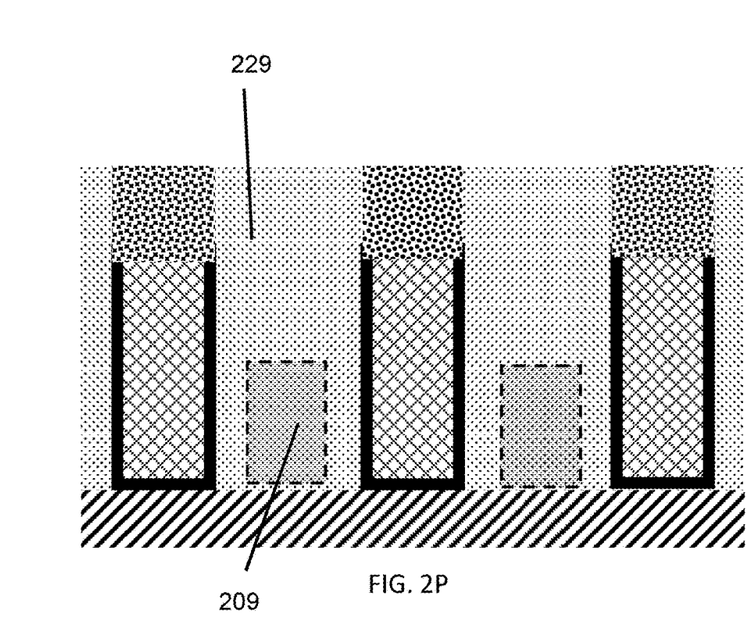
Figure 2Q:
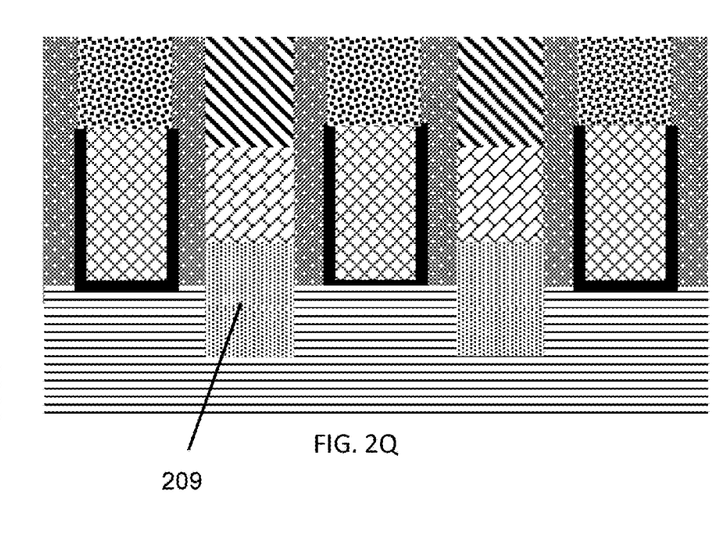

FIG. 2P is a cross-sectional view along line A-A' of FIG. 2E. FIG. 2Q is a cross-sectional view along line B-B' of FIG. 2E. A low-k dielectric 229 is deposited and planarized in the non-TS isolation region 227, as shown in FIG. 2P.

Figure 2R:
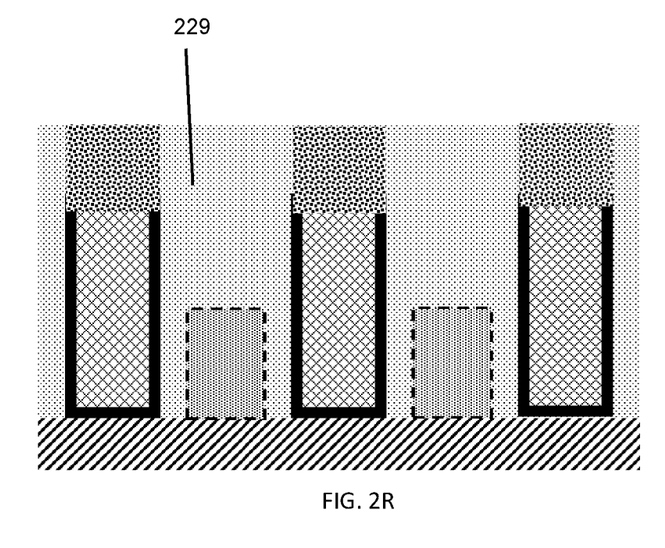
Figure 2S:
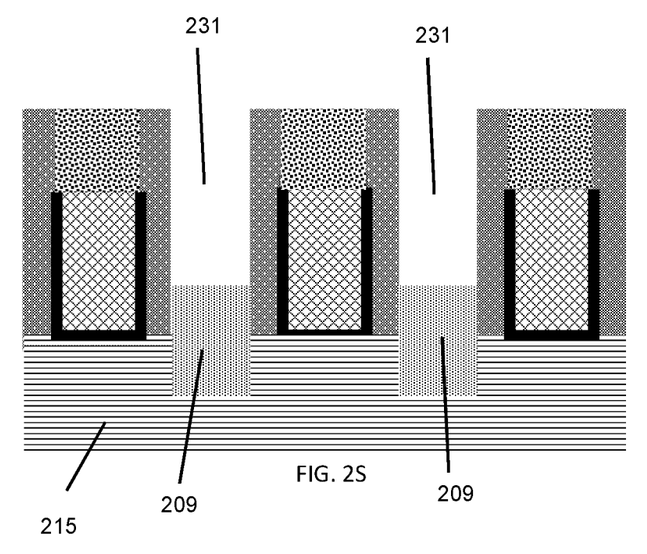

FIG. 2R is a cross-sectional view along line A-A' of FIG. 2E. FIG. 2S is a cross-sectional view along line B-B' of FIG. 2E. As shown in FIG. 2S, the bilayer ILD is removed from over the epi S/D region 209 to expose the epi S/D region 209. Openings 231 are for the epi S/D contacts to be formed at a later process.

Figure 2T:
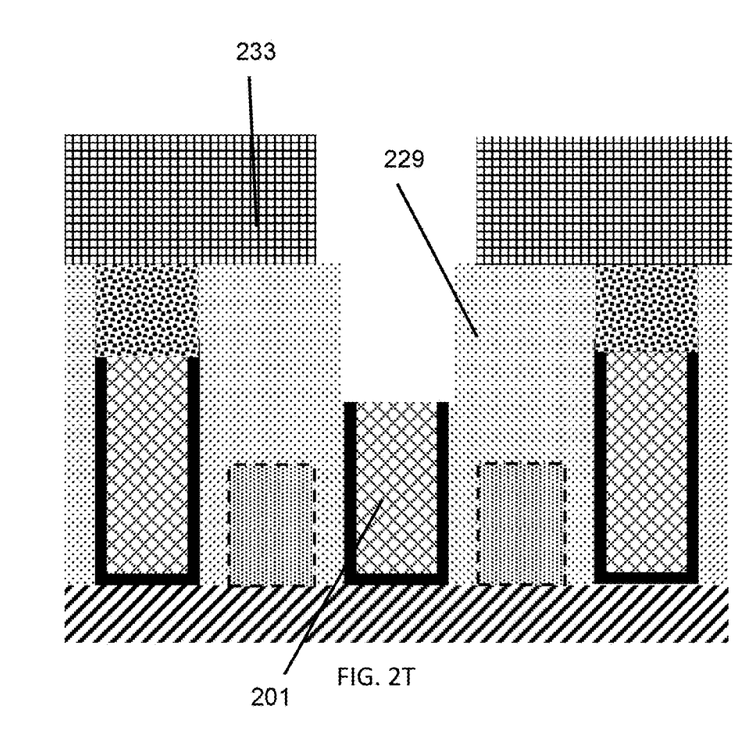
Figure 2U:
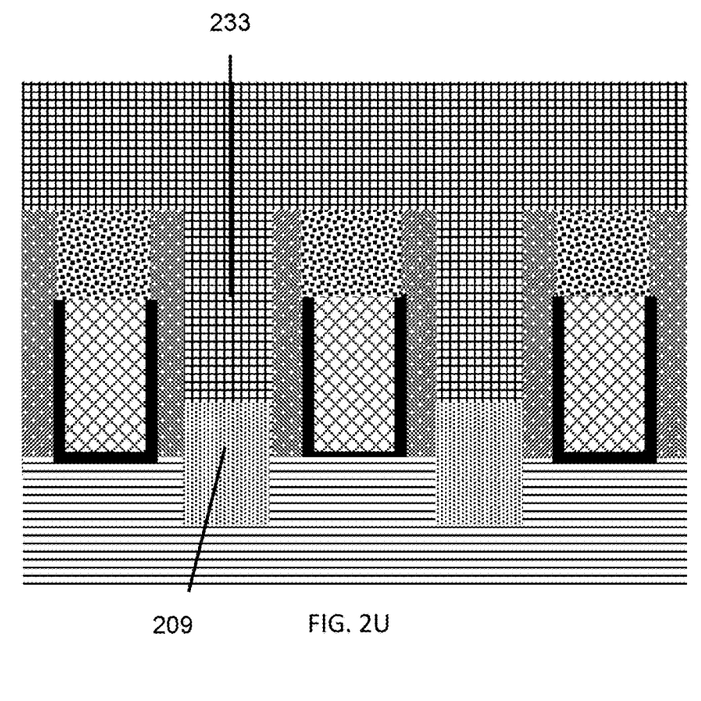

FIG. 2T is a cross-sectional view along line A-A' of FIG. 2E. FIG. 2U is a cross-sectional view along line B-B' of FIG. 2E. In FIG. 2T, an optical planarization layer (OPL) 233 is deposited and patterned over one of the HKMGs 201. A reactive ion etching (RIE) removes the low-k dielectric layer 229 and SiN cap 207 to expose an upper surface of the HKMG 201 where a gate contact 203 will be formed. In FIG. 2U, the OPL 233 fills the openings 231 over the epi S/D region 209.

Figure 2V:
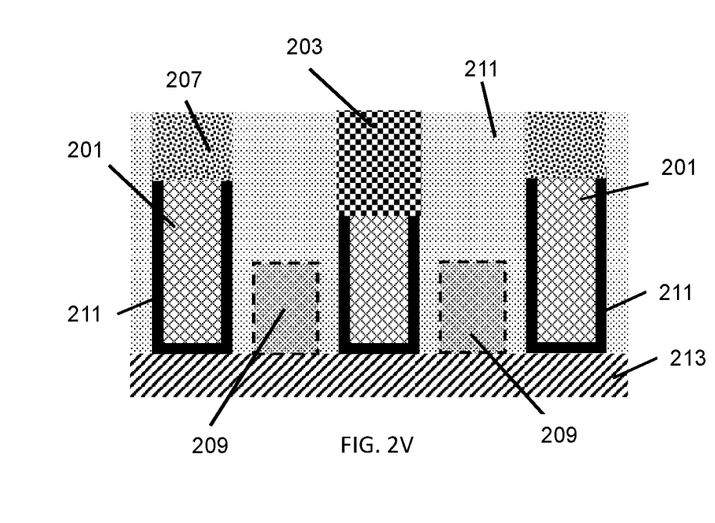
Figure 2W:
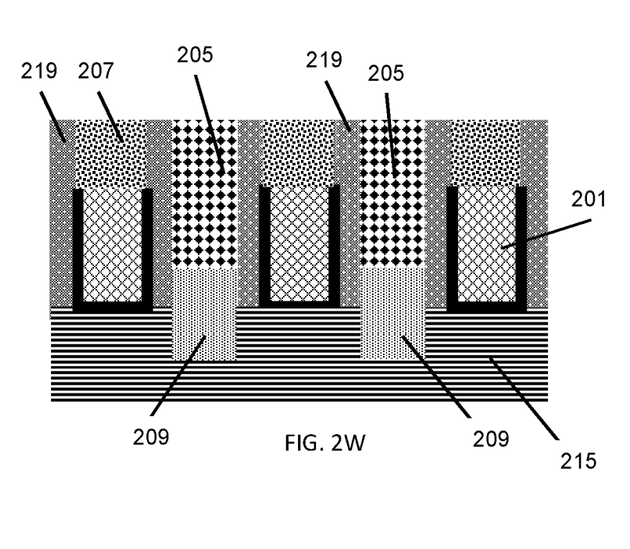

FIG. 2V is a cross-sectional view along line A-A' of FIG. 2E. FIG. 2W is a cross-sectional view along line B-B' of FIG. 2E. The remaining OPL 233 is stripped. Silicide and metallization are performed to produce the gate contact 203 and epi S/D contacts 205. Additional MOL processing can be performed following formation of contacts 203 and 205.

The embodiments of the present disclosure can achieve several technical effects, including preventing electrical shorts between gate contacts and a nearby epi S/D region. The embodiments of the present disclosure provide a novel processing technique to prevent such electrical shorts. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices using semiconductor fins in the advanced technology nodes, including 7 nanometers and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
fin field effect transistors (finFETs) formed over a substrate,
wherein a first finFET comprises an epitaxial source/drain (epi S/D) region formed at sides of a high dielectric constant metal gate (HKMG), and
wherein a second finFET is formed on one side of the epi S/D and a third finFET is formed on a second side of the epi S/D when viewed in cross-section and wherein the first finFET is disposed between the second finFET and the third finFET when viewed in cross-section;
a low dielectric constant layer formed between the first, second and third finFETs; and
a gate contact comprising a lower surface formed on an upper surface of the HKMG when viewed in cross-section and the gate contact not being in contact with the epi S/D region,
wherein the gate contact comprises side surfaces, and the low dielectric constant layer is in direct contact with an entirety of the side surfaces when viewed in cross-section, and
wherein the second finFET and the third finFET each have an upper surface with a nitride cap disposed on each upper surface of the second finFET and the third finFET when viewed in cross-section.

2. The device according to claim 1, wherein the epi S/D region comprises epitaxially grown silicon germanium (SiGe).

3. The device according to claim 1,
wherein the gate contact comprises tantalum, tungsten, titanium, or aluminum.

4. The device according to claim 1, the low dielectric constant layer comprises silicon oxide.

5. The device according to claim 4, wherein the silicon oxide comprises a silicon oxycarbide (SiOC) or silicon carbide (SiC).

* * * * *

UNITED STATES PATENT AND TRADEMARK OFFICE
CERTIFICATE OF CORRECTION

PATENT NO. : 10,804,379 B2
APPLICATION NO. : 15/980436
DATED : October 13, 2020
INVENTOR(S) : Hui Zang et al.

It is certified that error appears in the above-identified patent and that said Letters Patent is hereby corrected as shown below:

In the Drawings

Please replace Figs. 2V and Figs. 2W with Figs. 2V and Figs. 2W as shown on the attached page.

Signed and Sealed this
Seventh Day of September, 2021

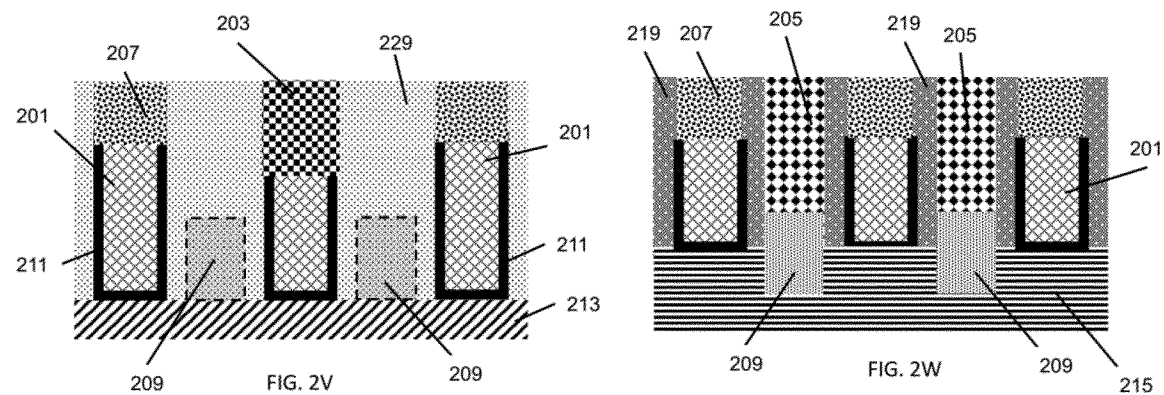

Drew Hirshfeld
*Performing the Functions and Duties of the*
*Under Secretary of Commerce for Intellectual Property and*
*Director of the United States Patent and Trademark Office*